United States Patent
Nakaya (10) Patent No.: US 7,502,706 B2
(45) Date of Patent: Mar. 10, 2009

(54) MODULE-TESTING DEVICE

(75) Inventor: Kazuyoshi Nakaya, Yokohama (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 365 days.

(21) Appl. No.: 10/507,846

(22) PCT Filed: Jun. 10, 2003

(86) PCT No.: PCT/IB03/02818

§ 371 (c)(1),
(2), (4) Date: Sep. 15, 2004

(87) PCT Pub. No.: WO03/107022

PCT Pub. Date: Dec. 24, 2003

(65) Prior Publication Data

US 2005/0119872 A1    Jun. 2, 2005

(30) Foreign Application Priority Data

Jun. 13, 2002 (JP) ............................. 2002-172863
Apr. 25, 2003 (JP) ............................. 2003-120957

(51) Int. Cl.
*G01R 31/00* (2006.01)
*G01R 31/14* (2006.01)

(52) U.S. Cl. ...................... 702/117; 702/118; 702/119; 702/120; 703/28

(58) Field of Classification Search ......... 702/117–122, 702/108, 115, 136, 188, 189; 703/28, 21; 324/754, 761; 326/38, 41; 438/128; 710/73, 710/10, 14, 62, 64, 8
See application file for complete search history.

(56) References Cited

U.S. PATENT DOCUMENTS

| | | | | |
|---|---|---|---|---|
| 5,036,479 A | * | 7/1991 | Prednis et al. | ............... 702/121 |
| 5,329,470 A | * | 7/1994 | Sample et al. | ................ 703/28 |
| 6,311,149 B1 | | 10/2001 | Ryan et al. | |

FOREIGN PATENT DOCUMENTS

| | | |
|---|---|---|
| DE | 19909892 | 9/2000 |
| JP | 10-063704 | 3/1998 |
| JP | 2001-186011 | 7/2001 |
| WO | WO 9309502 A | 5/1993 |

OTHER PUBLICATIONS

Official Communication issued in the corresponding Korean Patent Application No. 10-2004-7015138, dated Apr. 27, 2006.

* cited by examiner

*Primary Examiner*—Eliseo Ramos Feliciano
*Assistant Examiner*—Phuong Huynh
(74) *Attorney, Agent, or Firm*—Keating & Bennett, LLP (57) ABSTRACT

A wiring pattern circuit includes part of wiring between a module control circuit and a module. Since the wiring pattern circuit includes a PLD, the wiring thereof can be variably configured in accordance with the specifications of the module control circuit and the module. The construction of the module control circuit can be therefore facilitated. In addition, since a printed wiring pattern does not have to be provided separately for the test of each of a plurality of different modules, the test period, the labor and the cost involved during the test can be decreased.

18 Claims, 7 Drawing Sheets

MODULE-TESTING DEVICE

BACKGROUND OF THE INVENTION

1. Field of the Invention

The present invention relates to module-testing devices for testing a module to be evaluated (hereinafter, referred to as "the module"). The module is a circuit device with features for a predetermined purpose, such as an RF (Radio Frequency) module, a sensor module including a sensor and an accessory circuit thereof, or a radar module for forward acquisition, or other suitable circuit device.

2. Description of the Related Art

Figure 6:
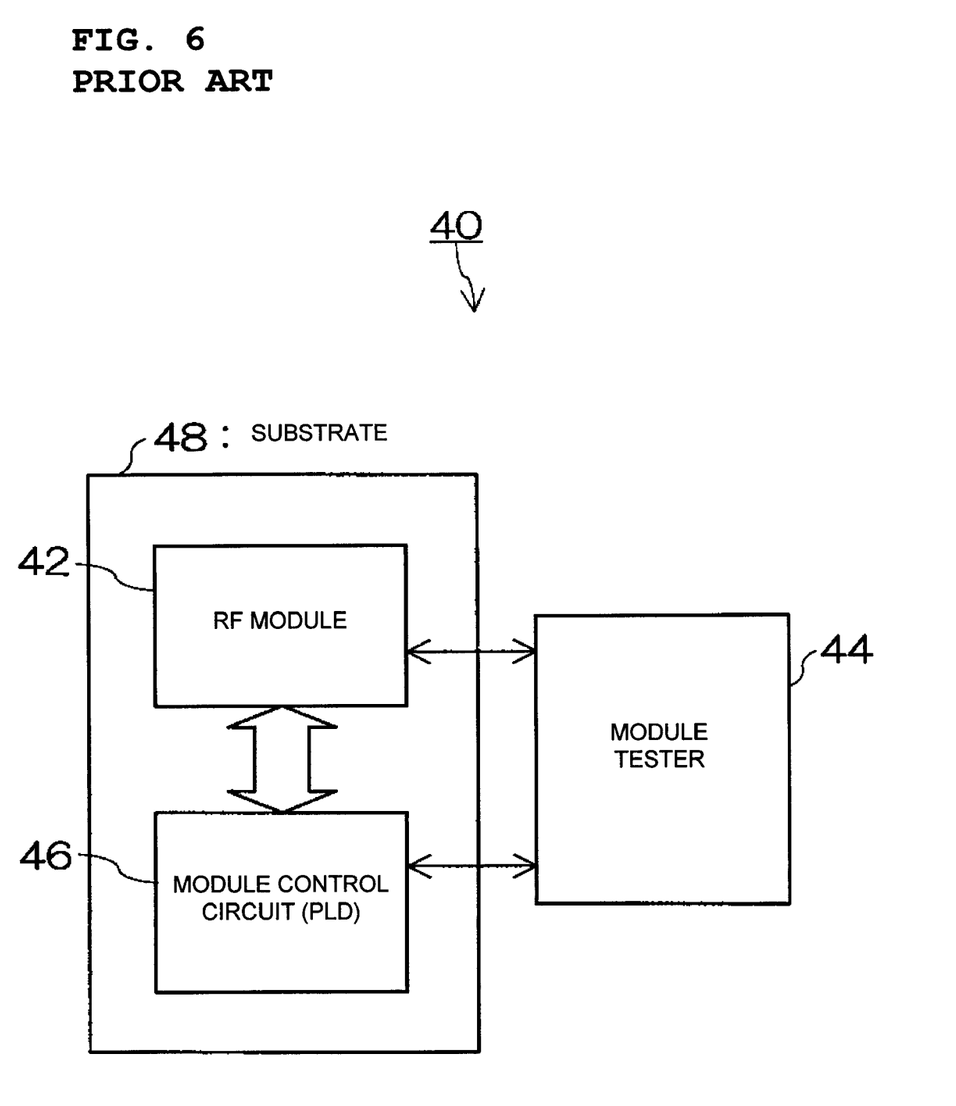
FIG. 6 is a block diagram showing a construction of a known module-testing device.

A known module-testing device will be described with reference to FIG. 6. FIG. 6 shows a construction of a module-testing device 40 that tests an RF module of a portable phone.

The RF module 42 performs signal processing in an RF band. The RF module 42 is, for example, a frequency synthesizer or a variable gain amplifier (hereinafter, referred to as "a component to be controlled") that is controlled in response to a digital control signal. When the RF module 42 is mounted in the portable phone, the control signal fed to the component to be controlled is output from a control circuit of the portable phone.

The module-testing device 40 includes a module tester 44 and a module control circuit 46. The module-testing device 40 realizes operations of the RF module 42 that is virtually implemented when the RF module 42 is at a developing stage, so that an operation test of the RF module 42 can be performed. The module control circuit 46 is mounted along with, for example, the RF module 42 on a testing substrate 48. A printed circuit pattern disposed on the testing substrate 48 allows the RF module 42 and the module control circuit 46 to be electrically connected.

The module tester 44 feeds a test signal, such as the RF reception signal or an IQ transmission signal (orthogonal signal), to the RF module 42 where predetermined processing, such as frequency conversion processing or amplification processing between the RF signal and the IQ signal, is applied to the test signal, which is fed back to the module tester 44. On the basis of the resultant signal, the module tester 44 determines whether the RF module 42 appropriately operates. The module control circuit 46 controls the module tester 44.

The module control circuit 46 produces a control signal (i.e. testing control signal) for controlling the components to be controlled in the RF module 42. In other words, the module control circuit 46 controls the module tester 44 and the components to be controlled of the RF module 42 to realize various virtual operating environments (test modes).

The specifications of the RF module 42 often vary in accordance with the model of the portable phone on which the RF module 42 is mounted. In addition, the specifications may be modified during the development of the RF module 42 (pre-production lot). Since the module control circuit 46 controls the components to be controlled of the RF module 42, whenever the specifications of the RF module 42 are modified, another module control circuit 46 must be provided or the module control circuit 46 must be updated so as to accommodate the modification in the specifications.

In view of the above-described circumstances, programmable logic devices (hereinafter, referred to as PLD), such as FPGA (Field Programmable Gate Array) and CPLD (Complex Programmable Logic Device), have been used. The PLD is a circuit that is capable of realizing various features by changing internal circuit components thereof. By adopting PLD as the module control circuit 46, the module control circuit 46 can be shared for tests of a plurality of RF modules with different specifications. Devices for simulation analysis with the aid of FPGA are disclosed in, for example, Japanese Unexamined Patent Application Publication No. 10-63704 and Japanese Unexamined Patent Application Publication No 2001-186011.

Figure 7:
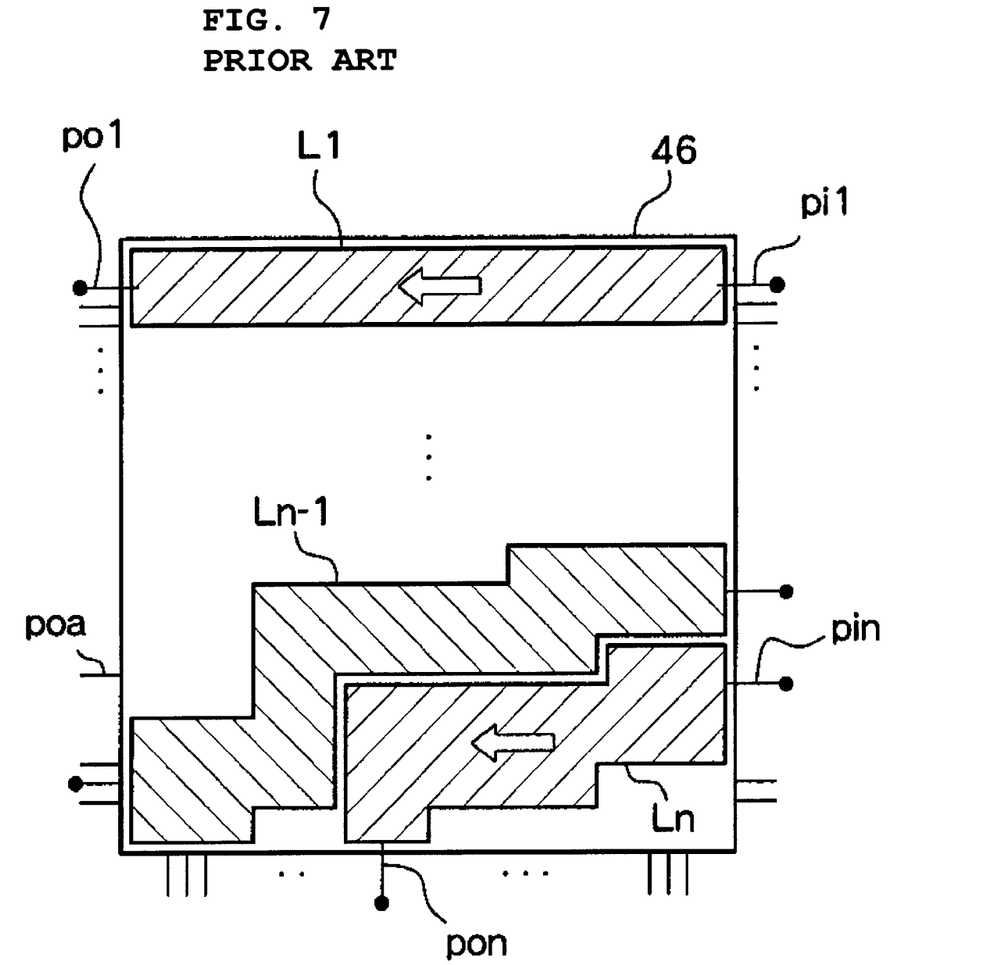
FIG. 7 an illustration showing that the input/output signal assignment to the input/output pins of a PLD depends on a circuit constructed in the PLD.

An input/output signal assignment for the input/output pins of the PLD (that is, the input/output positions of the PLD signals) is determined in accordance with a circuit construction (circuit arrangement) built inside the PLD. When, for example, a circuit $L_1$ is constructed at an early stage of a construction process of the module control circuit (PLD) 46, desired signal input/output positions $P_{i1}$, and $P_{o2}$ can be obtained as shown in FIG. 7. However, as the construction process of the module control circuit (PLD) 46 progresses, existing circuits constructed in the module control circuit (PLD) 46 may restrict input/output positions of a newly assigned circuit. When, for example, a circuit $L_n$ shown in FIG. 7 is constructed, even though a desired signal output position is a pin $P_{oa}$, the presence of existing circuits $L_1$ to $L_{n-1}$ in the module control circuit (PLD) 46 causes the signal output position to not be the pin $P_{oa}$ but a pin $p_{on}$. In particular, the larger the circuits built in the module control circuit (PLD) 46, the fewer the number of the unused gates of the module control circuit (PLD) 46, making it more difficult to assign input/output signals to desired corresponding input/output pins.

Since the printed circuit pattern between the RF module 42 and the module control circuit (PLD) 46 establishes electrical connection between the respective input/output pins thereof, the printed circuit pattern must be produced so that the input/output signal assignment thereof corresponds to the input/output pins of the PLD (module control circuit 46). When the construction of the module control circuit (PLD) 46 in accordance with the specifications of each RF module 42 causes the signal input/output positions of the printed circuit pattern between the RF module 42 and the module control circuit (PLD) 46 to be varied, the printed circuit pattern must be produced separately so as to accommodate each module control circuit (PLD) 46. In other words, even though the PLD is adopted as the module control circuit 46 to intend to be shared for testing different RF modules, the printed circuit pattern between the RF module 42 and the module control circuit 46 is often difficult to be shared. Producing the printed circuit pattern individually leads to lengthening the development time and increasing the labor and the cost involved in the development.

SUMMARY OF THE INVENTION

In order to overcome the problems described above, preferred embodiments of the present invention provide a module-testing device, for testing a module, including at least one module control circuit including a first programmable logic device, at least one module control circuit feeding a testing control signal to the module, an I/O port for transmitting a signal to and receiving a signal from an external device, a first wiring pattern circuit including a second programmable logic device, the first wiring pattern circuit including at least part of a wiring between at least one module control circuit and the I/O port, and a configuration circuit for constructing circuit configurations of at least one module control circuit and the first wiring pattern circuit on the basis of input information. Thus, when the input positions of several signals to the module control circuit do not correspond to the output positions of the signals from the module control circuit, the first wiring pattern circuit can be shared as a wiring between the module control circuit and the I/O port.

The module-testing device may further include a second wiring pattern circuit including a third programmable logic device. In the module-testing device, at least one module control circuit preferably includes at least two module control circuits, the second wiring pattern circuit including at least part of a wiring between at least two module control circuits, and the configuration circuit constructs a circuit configuration of the second wiring pattern circuit on the basis of the input information. Thus, when the input positions of several signals to module control circuits do not correspond to the output positions of the signals from the module control circuits, the second wiring pattern circuit can be shared as wiring among a plurality of module control circuits.

Other features, elements, characteristics and advantages of the present invention will become more apparent from the following detailed description of preferred embodiments with reference to the attached drawings.

DETAILED DESCRIPTION OF PREFERRED EMBODIMENTS

Figure 1:
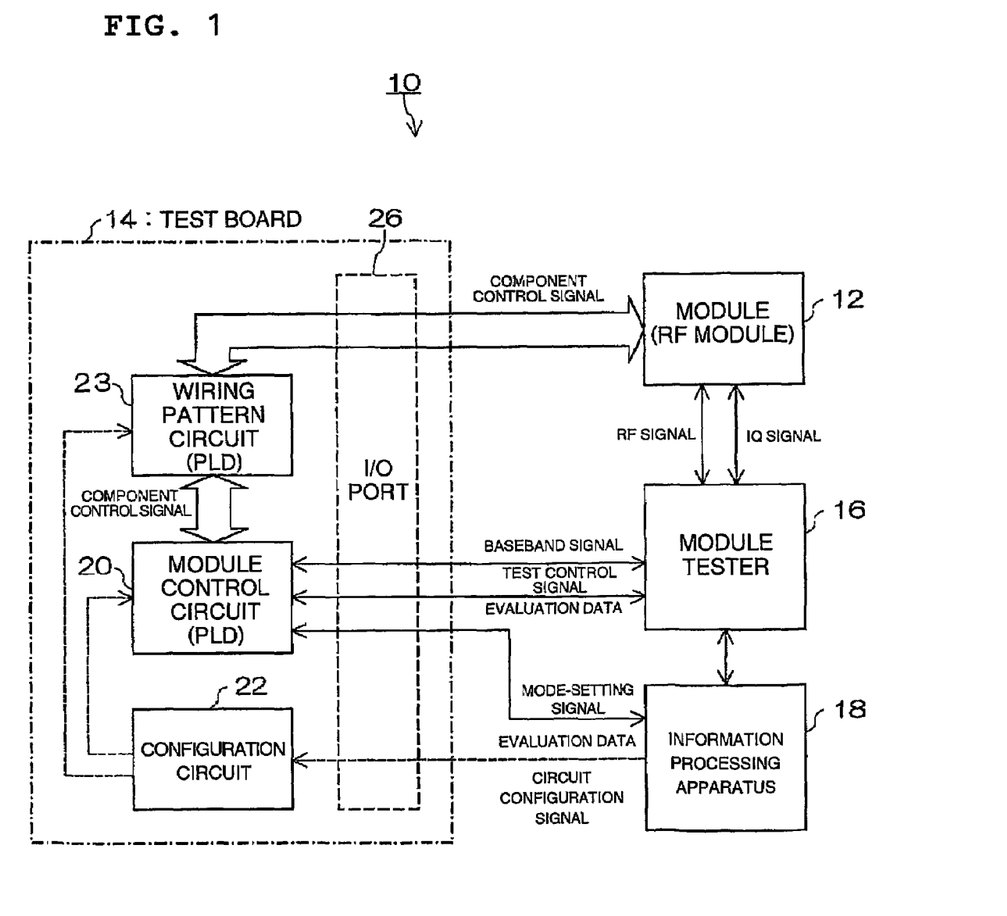
FIG. 1 is a block diagram showing a construction of a module-testing device according to a first preferred embodiment of the present invention.
Figure 2:
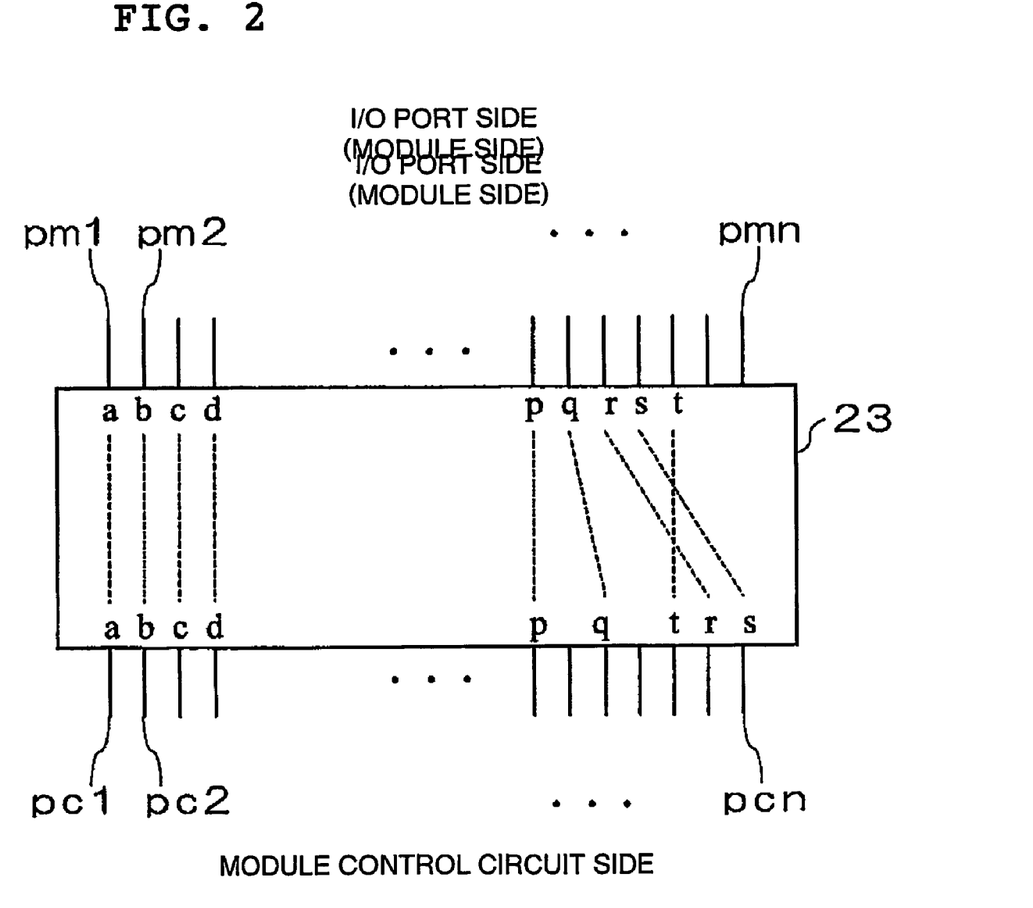
FIG. 2 is a diagram showing an example signal assignment to input/output terminals of the module-testing device according to the first preferred embodiment of the present invention.
Figure 3:
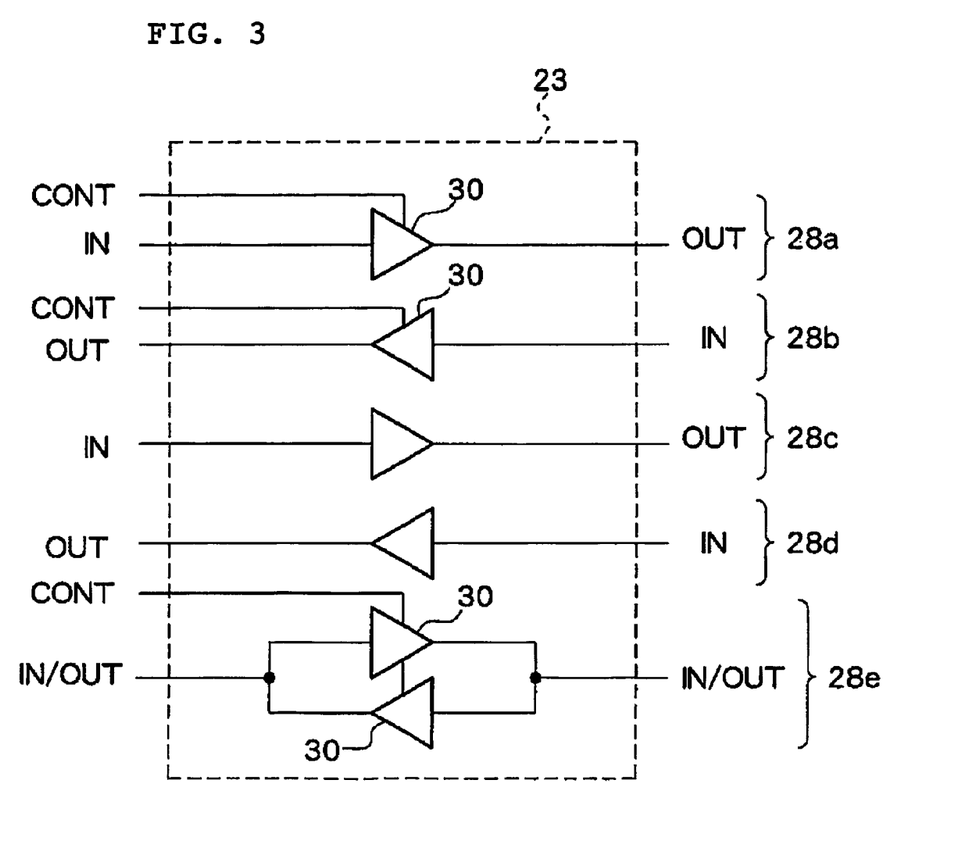
FIG. 3 is a diagram showing an example wiring-pattern construction of a wiring pattern circuit according to the first preferred embodiment of the present invention.

FIG. 1 shows a construction of a module-testing device 10 according to a first preferred embodiment of the present invention; FIG. 2 shows an example signal assignment for input/output pins of a wiring pattern circuit 23; FIG. 3 shows a wiring pattern of the wiring pattern circuit 23.

The module-testing device 10 preferably includes a test board 14, a module tester 16, and an information processing apparatus 18. The test board 14 includes a module control circuit 20, a configuration circuit 22, the wiring pattern circuit 23, and an I/O port 26. Each component of the test board 14 is mounted on, for example, a substrate (not shown). The module-testing device 10 can evaluate modules, such as an RF module for portable phones and a high frequency circuit for a power source unit.

The module tester 16 produces an input signal feeding to a module 12 based on a testing control signal fed from the module control circuit 20 via the I/O port 26. The input signal corresponds to an RF reception signal, an IQ transmission signal, or the like when the module 12 is the RF module.

The module 12 applies predetermined processing to the input signal fed from the module tester 16. The module 12 includes a component for applying the predetermined processing, at least part of the component (hereinafter, referred to as "a component to be controlled") which is controlled in accordance with a digital control signal (hereinafter, referred to as "a component control signal"). The component control signal that is produced by the module control circuit 20 is fed to the component to be controlled via the wiring pattern circuit 23 and the I/O port 26. When the module 12 is the RF module, the component to be controlled corresponds to a frequency synthesizer that changes the frequency of a signal in accordance with a frequency channel or a variable gain amplifier that amplifies a signal with a predetermined gain. The frequency synthesizer changes a local oscillation frequency in accordance with the component control signal, and the variable gain amplifier changes the gain in accordance with the component control signal.

The module 12 applies the predetermined processing to the signal (output signal), which is fed back to the module tester 16. When the module 12 is the RF module, the output signal corresponds to an IQ reception signal, an RF transmission signal, or the like.

The module tester 16 determines (evaluates) whether the output signal from the module 12 is an appropriate response to the input signal to the module 12. The module tester 16 produces the evaluation data, which is, directly or by way of the module control circuit 20, fed to the information processing apparatus 18, such as a personal computer. The information processing apparatus 18 performs predetermined computation processing based on the evaluation data to produce data representing evaluation results. When the module 12 is the RF module, a modem is disposed for permitting conversion between the IQ signal and a baseband signal to cause the module control circuit 20 to perform testing or evaluation based on the baseband signal (digital). In FIG. 1, the modem is incorporated in the module tester 16.

The module control circuit 20 is constructed in a known PLD, such as FPGA or CPLD, using a known method. To be specific, the information processing apparatus 18 obtains a circuit diagram of the module control circuit 20 or information describing the circuit thereof, such as information described with HDL (Hardware Description Language), to produce circuit configuration information. On the basis of the circuit configuration information, the configuration circuit 22 produces data for determining the features of each unit logic circuit in the PLD, such as a macro cell, and determining an interconnection therebetween. The resultant data is fed into the PLD. Thus, the module control circuit 20 that performs various evaluation tests in accordance with the specifications and test modes of the module 12 is constructed in the PLD.

The wiring pattern circuit (a first wiring pattern circuit) 23 is also constructed in a known PLD in the same manner. The wiring pattern circuit 23 primarily serves to construct a wiring pattern to establish connection between desired input/output terminals of one end (for example, the module control circuit 20) and corresponding desired input/output terminals of the other end (for example, the I/O port 26 and the module 12). Therefore, an operator enters information specifying the features of wiring and information specifying input/output terminals of the PLD for wiring to the information processing apparatus 18. On the basis of the entered information, the wiring pattern circuit 23 is constructed in the PLD. As shown in FIG. 2, signals (represented by a, b, c, . . . ) can be assigned to the input/output terminals (pins) ($p_{m1}$ to $p_{mn}$) on the I/O port 26 side of the PLD (wiring pattern circuit 23) in accordance with a signal assignment (assignment positions or assignment orders) for the input/output terminals of the I/O port 26 (ultimately, the module 12). The signals can be assigned to the input/output terminals (pins) ($pc_1$ to $p_{cn}$) on the module control circuit 20 side of the PLD (wiring pattern circuit 23) in accordance with a signal assignment (assignment positions or assignment orders) for the input/output terminals of the module control circuit 20.

The logic circuit of each wiring pattern in the wiring pattern circuit 23 can be limited to several types of circuits (28a, 28b, 28c, 28d, and 28e) in which each has a counterpart whose only difference is the direction of IN/OUT as shown in FIG. 3. In other words, the wiring pattern circuit 23 according to the present preferred embodiment is specialized in establishing the connection between components (for example, between the module control circuit 20 and the I/O port 26 or between a plurality of modules 12). This specialization enables the wiring pattern circuit 23 to be miniaturized and lightweight compared to a universal PLD, such as the PLD used as the module control circuit 20, which includes a variety of logic circuits for realizing various features. In FIG. 3, a control buffer 30 each performs switching between the open and the close of the corresponding one of the circuits 28a to 28e in accordance with a switch control signal (CONT).

The wiring pattern circuit 23 enables the wiring between the module control circuit 20 and the I/O port 26 (ultimately, the module 12) to be freely changed in accordance with their specifications. Unlike known methods, the printed circuit pattern does not have to be individually provided in accordance with the specifications. When the printed circuit pattern is disposed on the substrate in a known manner, the signals (component control signals) have to be pre-assigned to the input/output pins of the module control circuit 20 in accordance with the specifications of the module 12 (e.g. the number of the input/output pins) or the assignment of the signals to the input/output pins of the module 12 so that none of the wiring patterns crosses one another. In contrast, the provision of the wiring pattern circuit 23 according to the present preferred embodiment greatly alleviates the above-described restrictions, so that the module control circuit 20 with desired features can be more easily and quickly constructed.

When the test is performed with the known method at the development stage of the module 12, the following steps must be taken in view of the wiring restrictions: the module 12 is initially constructed and an arrangement of the pin positions thereof is determined; the wiring between the module 12 and the module control circuit 20 is determined; and then the module control circuit 20 is constructed. That is, the design of the module control circuit 20 cannot be started until the module 12 and the printed circuit pattern are almost completely determined, which lengthens the development time.

On the other hand, the provision of the wiring pattern circuit 23 permits the connection between arbitrary input/output pins. This enables the development of the module control circuit 20 to proceed in parallel with the development of the module 12.

It is sufficient for the wiring pattern circuit 23 to include at least part of the wiring between the module control circuit 20 and the I/O port 26. That is, instead of, as shown in FIG. 1, all of the wiring going via the wiring pattern circuit 23 between the module control circuit 20 and the I/O port 26, only part of it may go via the wiring pattern circuit 23 with the rest of it directly establishing the connection between the module control circuit 20 and the I/O port 26. Although only the component control signal is exchanged via the wiring pattern circuit 23 between the I/O port 26 and the module control circuit 20 in FIG. 1, another signal, such as the baseband signal, the testing control signal, a mode setting signal, or the evaluation data, may be fed via the wiring pattern circuit 23. Alternatively, the information processing apparatus 18 for testing the module 12 and another information processing apparatus for producing circuit configuration information fed to the configuration circuit 22 in order to construct circuit configurations in the module control circuit 20 and the wiring pattern circuit 23 may be separately provided.

A test board 34 according to a second preferred embodiment of the present invention will be described with reference to FIG. 4, which shows a construction of the test board 34.

Figure 4:
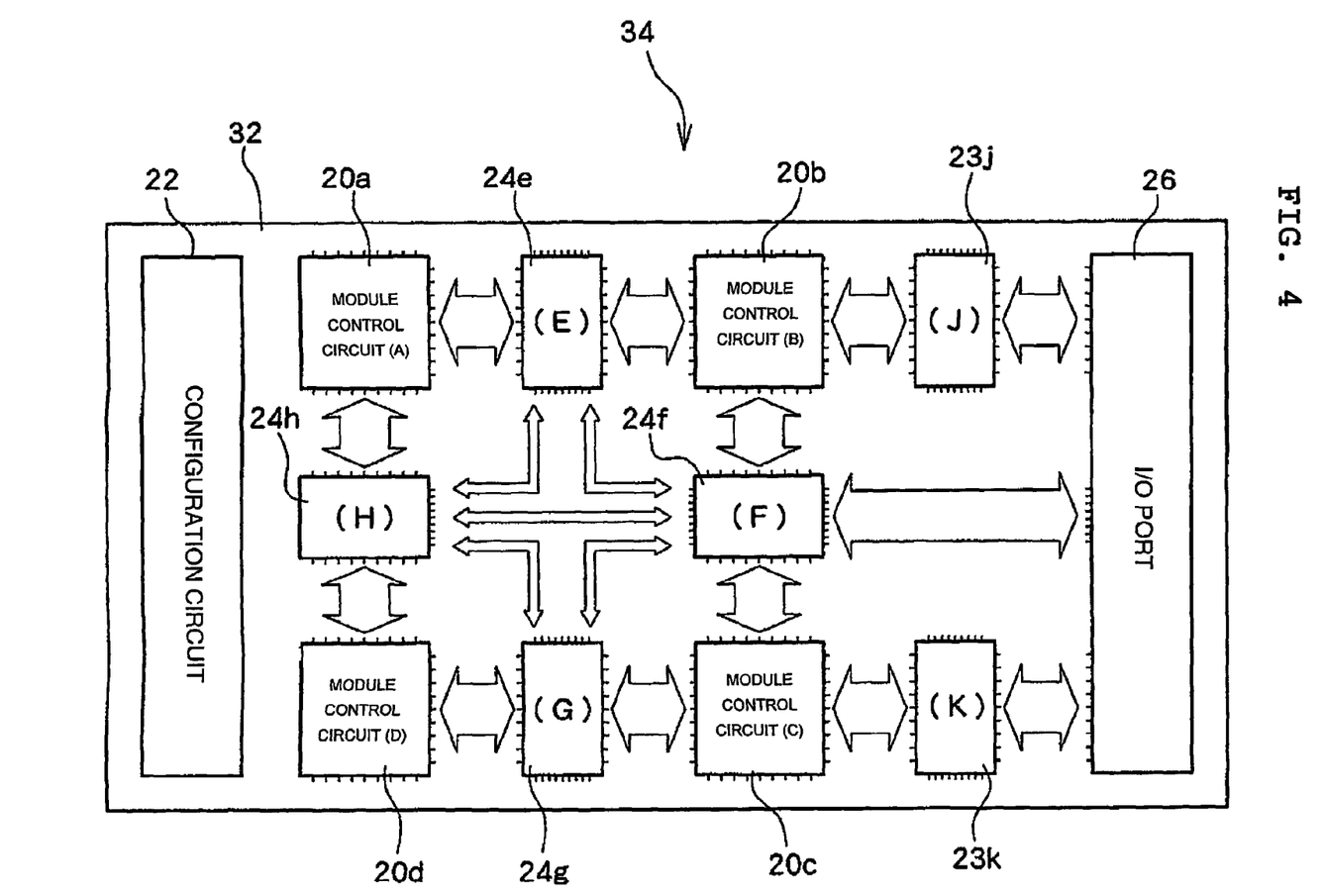
FIG. 4 is a block diagram showing a construction of a test board of a module-testing device according to a second preferred embodiment of the present invention.

In FIG. 4, the configuration circuit 22 is provided at one end of a substantially rectangular substrate 32 in the longitudinal direction thereof while the I/O port 26 is provided at the other end thereof. Substantially square module control circuits 20a to 20d are provided in a two-by-two matrix arrangement between the configuration circuit 22 and the I/O port 26. Substantially rectangular second wiring pattern circuits 24e to 24h are sandwiched between two adjacent module control circuits 20a to 20d. A first wiring pattern circuits 23j is provided between the module control circuit 20b and the I/O port 26, and a first wiring pattern circuit 23k is provided between the module control circuit 20c and the I/O port 26. The first wiring pattern circuits 23j and 23k and the second wiring pattern circuits 24e to 24h preferably have the same construction as the construction of the wiring pattern circuit 23 in the first preferred embodiment, and they are preferably constructed using the same method as the one described in the wiring pattern circuit 23 of the first preferred embodiment.

When the module 12 (FIG. 1) is specified to be provided with a plurality of components to be controlled, or when the number of test modes increases, the circuit scale of the module control circuit (20a to 20d) increases. The test board 34 according to the present preferred embodiment is provided with a plurality of the module control circuits 20a to 20d, the wiring pattern circuits 24e to 24h each include part of the wiring between two of the module control circuits 20a to 20d that are adjacent to each other. The present preferred embodiment enables a larger control circuit to be constructed using the distribution of a plurality of the module control circuits 20a to 20d. In addition, when each of the module control circuits 20a to 20d is constructed, since restrictions of an input/output signal assignment to the input/output pins are alleviated, the module control circuits 20a to 20d performing desired features can be constructed more easily and more quickly. Since each of the wiring pattern circuits 24e to 24h is electrically connected as shown in FIG. 4, the degree of freedom of the circuit construction increases more. In addition, not all but some of the plurality of module control circuits 20a to 20d may be used to construct the circuit. In other words, the test board 34 according to the present preferred embodiment can accommodate various scales of circuits, ranging from large-scale circuits to small-scale circuits, making the test board 34 more versatile than the test board 14 according to the test board 14. The wiring may go via the wiring pattern circuit 24f between the module control circuits 20b and the I/O port 26 and between the module control circuit 20c and the I/O port 26. In this case, the circuit pattern circuit 24f also functions as the first wiring pattern circuit.

A test board 36 according to a third preferred embodiment of the present invention will be described with reference to FIG. 5, which shows a construction of the test board 36.

Figure 5:
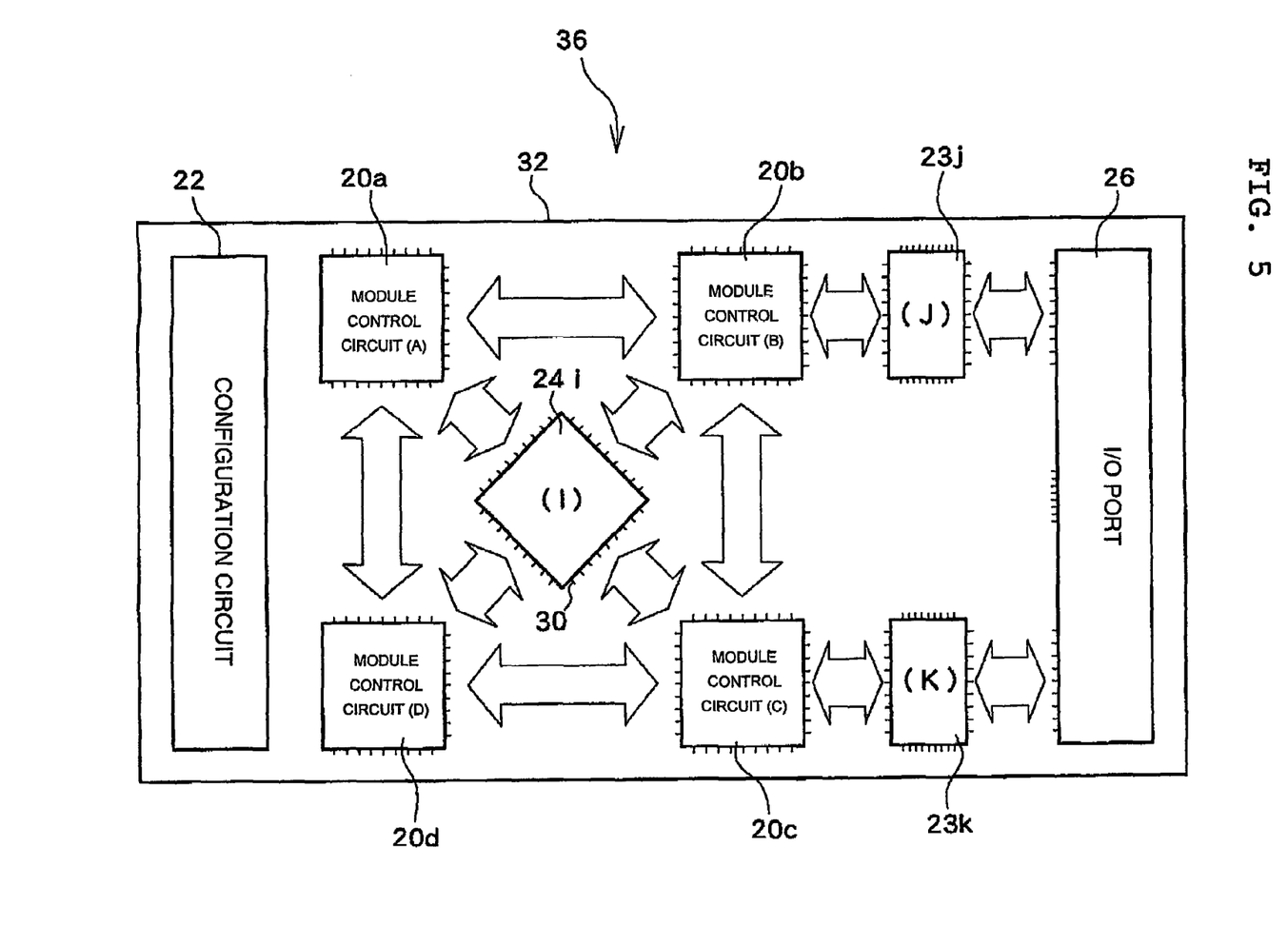
FIG. 5 is a block diagram showing a construction of a test board of a module testing device according to a third preferred embodiment of the present invention.

In FIG. 5, the configuration circuit 22 is provided at one end of the substrate 32 in the longitudinal direction thereof while the I/O port 26 is provided at the other end thereof. The module control circuits 20a to 20d are provided in a two-by-two matrix arrangement between the configuration circuit 22 and the I/O port 26. A wiring pattern circuit 24i is provided in the center of the module control circuits 20a to 20d. The first wiring pattern circuit 23j is provided between the module control circuit 20b and the I/O port 26, and the first wiring pattern circuit 23k is provided between the module control circuit 20c and the I/O port 26. The wiring pattern circuits 23j, 23k, and 24i preferably have the same construction as the construction of the wiring pattern circuit 23 in the first preferred embodiment, and they are constructed using the same method as the one described in the wiring pattern circuit 23 of the first preferred embodiment.

Since the wiring pattern circuits 23j, 23k, and 24i are shared among more number of module control circuits in the test board 36 according to the third preferred embodiment of the present invention, the circuit construction of the test board 36 is greatly simplified compared to the test board 34 according to the second preferred embodiment. Even such a simplified construction of the test board 36 permits the same features as the ones obtained in the test board 34 according to the second preferred embodiment.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A module-testing device for testing a module, comprising:
    at least one module control circuit including a first programmable logic device, said at least one module control circuit feeding a component control signal to the module;
    an I/O port arranged to transmit a signal to and receive a signal from an external device, and the component control signal fed to the module is fed via the I/O port;
    a first wiring pattern circuit including a second programmable logic device, the first wiring pattern circuit including at least part of a wiring between said at least one module control circuit and the I/O port;
    a configuration circuit for constructing circuit configurations of said at least one module control circuit and the first wiring pattern circuit on the basis of input information; and
    a tester arranged to produce an input signal to the module based on a testing control signal fed from the at least one module control circuit via the I/O port; wherein
    the I/O port is arranged outside the at least one module control circuit;
    the I/O port includes a plurality of input/output terminals;
    the at least one module control circuit includes a plurality of input/output terminals;
    the first wiring pattern circuit includes a plurality of first input/output terminals connected to the plurality of input/output terminals of the I/O port and a plurality of second input/output terminals connected to the plurality of input/output terminals of the at least one module control circuit; and
    the first wiring pattern circuit is arranged to selectively assign the component control signal to any one of the first input/output terminals in accordance with a signal assignment for the input/output terminals of the I/O port and to selectively assign the component control signal to any one of the second input/output terminals in accordance with a signal assignment for the input/output terminals of the at least one module control circuit, so as to enable the wiring between the at least one module control circuit and the I/O port to be freely changed.

2. A module-testing device according to claim 1, further comprising a test board having the at least one module control circuit, the I/O port and the configuration circuit thereon.

3. A module-testing device according to claim 1, wherein the tester receives an output signal from the module and determines whether the output signal from the module is an appropriate response to the input signal to the module.

4. A module-testing device according to claim 1, wherein the tester includes a module.

5. A module-testing device according to claim 1, wherein the configuration circuit produces data for determining the features of each unit logic circuit in the first programmable logic device and the data produced by the configuration circuit is output to the first programmable logic device.

6. The module-testing device according to claim 1, wherein said at least one module control circuit includes a plurality of module control circuits arranged in a two-by-two matrix configuration.

7. The module-testing device according to claim 6, further comprising a plurality of said first wiring pattern circuits each being disposed between an adjacent pair of the plurality of module control circuits.

8. The module-testing device according to claim 6, wherein the first wiring pattern circuit is disposed between four of the plurality of module control circuits.

9. The module-testing device according to claim 1, further comprising an information processing apparatus arranged to obtain a circuit diagram of the at least one module control circuit and to provide a circuit configuration signal to the configuration circuit.

10. A module-testing device according to claim 2, wherein the at least one module control circuit and the configuration circuit are adjacent to the I/O port on the test board.

11. A module-testing device for testing a module, comprising:
    at least one module control circuit including a first programmable logic device, said at least one module control circuit feeding a component control signal to the module;
    an I/O port arranged to transmit a signal to and receive a signal from an external device, and the component control signal fed to the module is fed via the I/O port;
    a first wiring pattern circuit including a second programmable logic device, the first wiring pattern circuit including at least part of a wiring between said at least one module control circuit and the I/O port;
    a configuration circuit for constructing circuit configurations of said at least one module control circuit and the first wiring pattern circuit on the basis of input information; and
    a second wiring pattern circuit including a third programmable logic device, wherein:
    said at least one module control circuit includes at least two module control circuits;
    the second wiring pattern circuit including at least part of a wiring between said at least two module control circuits;
    the configuration circuit constructs a circuit configuration of the second wiring pattern circuit on the basis of the input information; and
    the I/O port is arranged outside the at least one module control circuit;
    the I/O port includes a plurality of input/output terminals;
    the at least one module control circuit includes a plurality of input/output terminals;
    the first wiring pattern circuit includes a plurality of first input/output terminals connected to the plurality of input/output terminals of the I/O port and a plurality of second input/output terminals connected to the plurality of input/output terminals of the at least one module control circuit; and the first wiring pattern circuit is arranged to selectively assign the component control signal to any one of the first input/output terminals in accordance with a signal assignment for the input/output terminals of the I/O port and to selectively assign the component control signal to any one of the second input/output terminals in accordance with a signal assignment for the input/output terminals of the at least one module control circuit, so as to enable the wiring between the at least one module control circuit and the I/O port to be freely changed.

12. A module-testing device according to claim 11, further comprising a test board having the at least one module control circuit, the I/O port and the configuration circuit thereon.

13. A module-testing device according to claim 11, wherein the configuration circuit produces data for determining the features of each unit logic circuit in the first programmable logic device and the data produced by the configuration circuit is output to the first programmable logic device.

14. A test board for use with a module-testing device, the test board comprising:
- a substrate;
- a configuration circuit provided at one end of the substrate;
- an I/O port provided at the other end of the substrate;
- module control circuits arranged in a two-by-two matrix on the substrate between the configuration circuit and the I/O port;
- a plurality of first wiring pattern circuits, at least two of the plurality of first wiring pattern circuits being provided between a respective one of the module control circuits and the I/O port; and
- a plurality of second wiring pattern circuits sandwiched between two adjacent ones of the module control circuits.

15. The test board according to claim 14, wherein the plurality of second wiring pattern circuits each includes a part of the wiring between two of the module control circuits that are adjacent to each other.

16. A test board according to claim 14, wherein at least one of the plurality of second wiring patterns is disposed between four of the module control circuits.

17. A test board according to claim 14, wherein the module control circuits include programmable logic devices.

18. A test board according to claim 14, wherein the plurality of first wiring pattern circuits and the plurality of second wiring pattern circuits include programmable logic devices.

* * * * *